(12) United States Patent
Ueda et al.

(10) Patent No.: US 7,974,322 B2
(45) Date of Patent: Jul. 5, 2011

(54) NITRIDE SEMICONDUCTOR LASER DIODE

(75) Inventors: Tetsuzo Ueda, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 3 days.

(21) Appl. No.: 12/686,839

(22) Filed: Jan. 13, 2010

(65) Prior Publication Data
US 2010/0172387 A1       Jul. 8, 2010

Related U.S. Application Data

(63) Continuation of application No. 11/979,877, filed on Nov. 9, 2007, now Pat. No. 7,664,151.

(30) Foreign Application Priority Data

Nov. 9, 2006   (JP) .................................. 2006-304139

(51) Int. Cl.
*H01S 5/00*   (2006.01)
(52) U.S. Cl. ............................... 372/44.011; 372/45.012
(58) Field of Classification Search .................. 349/105; 257/25; 372/45.01, 45.012, 50.124
See application file for complete search history.

(56) References Cited

U.S. PATENT DOCUMENTS

| | | | |
|---|---|---|---|
| 5,111,467 A * | 5/1992 | Bradley ........................... | 372/32 |
| 5,247,533 A | 9/1993 | Okazaki et al. | |
| 5,583,879 A | 12/1996 | Yamazaki et al. | |
| 5,585,648 A | 12/1996 | Tischler | |
| 5,604,763 A | 2/1997 | Kato et al. | |
| 5,843,227 A | 12/1998 | Kimura et al. | |
| 5,864,171 A | 1/1999 | Yamamoto et al. | |
| 5,970,081 A * | 10/1999 | Hirayama et al. ............... | 372/96 |
| 6,080,599 A | 6/2000 | Yamamoto et al. | |
| 6,680,959 B2 | 1/2004 | Tanabe et al. | |
| 6,750,072 B2 * | 6/2004 | Buchanan et al. ............... | 438/24 |
| 7,103,081 B2 * | 9/2006 | Nomaguchi ............... | 372/49.01 |
| 2005/0117085 A1 | 6/2005 | Taira et al. | |

FOREIGN PATENT DOCUMENTS

JP       2004-031657       1/2004

OTHER PUBLICATIONS

Nakamura, et al., "High-Power, Long-Lifetime InGaN/GaN/AlGaN-Based Laser Diodes Grown on Pure GaN Substrates," Japanese Journal of Applied Physics, vol. 37, pp. L309-L312, 1998.
Egawa, et al., "High Performance of InGaN LEDs on (111) Silicon Substrates Grown by MOCVD," IEEE Electron Device Letters, vol. 26, No. 3, Mar. 2005.
Hikita, M., et al., "AlGaN/GaN Power HFET on Silicon Substrate With Source- Via Grounding (SVG) Structure", IEEE Transactions On Electron Devices, Sep. 2005, pp. 1963-1968, vol. 52 No. 9, IEEE.

* cited by examiner

*Primary Examiner* — Minsun Harvey
*Assistant Examiner* — Tuan N. Nguyen
(74) *Attorney, Agent, or Firm* — McDermott Will & Emery LLP

(57) ABSTRACT

A nitride semiconductor laser device includes: a substrate made of silicon in which a plane orientation of a principal surface is a {100} plane; and a semiconductor laminate that includes a plurality of semiconductor layers formed on the substrate and includes a multiple quantum well active layer, each of the plurality of semiconductor layers being made of group III-V nitride. The semiconductor laminate has a plane parallel to a {011} plane which is a plane orientation of silicon as a cleavage face and the cleavage face constructs a facet mirror.

10 Claims, 6 Drawing Sheets

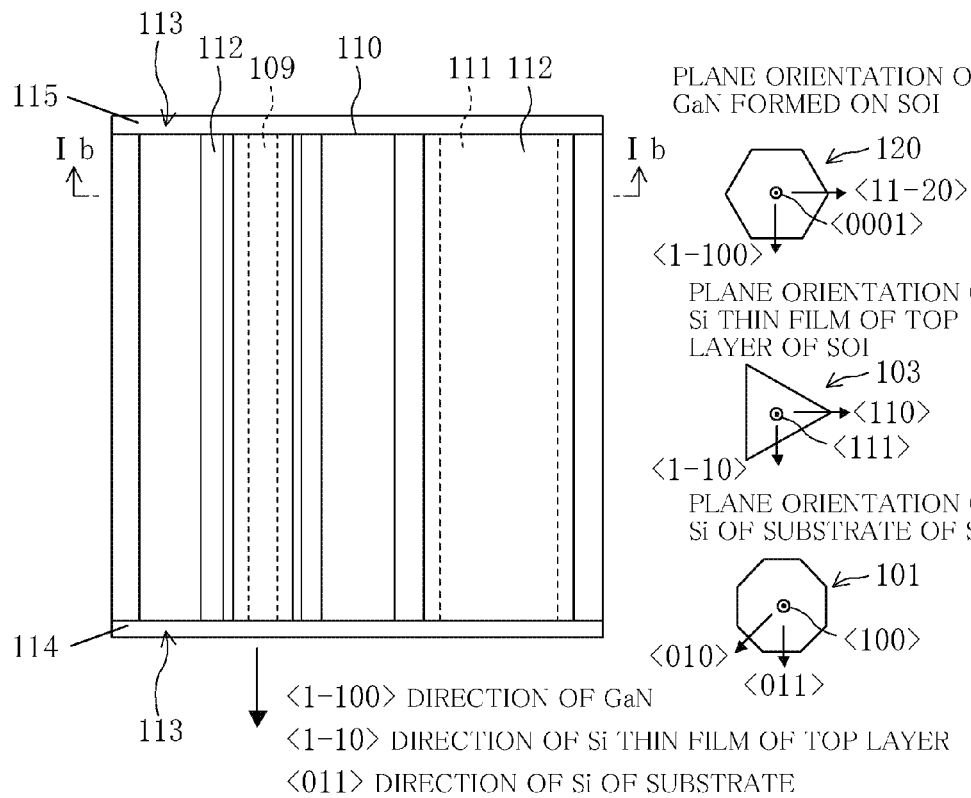
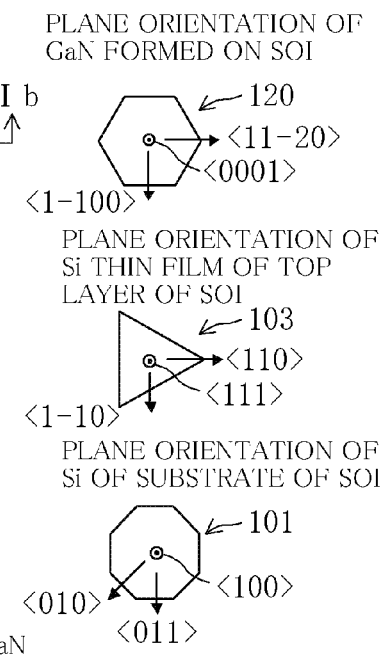
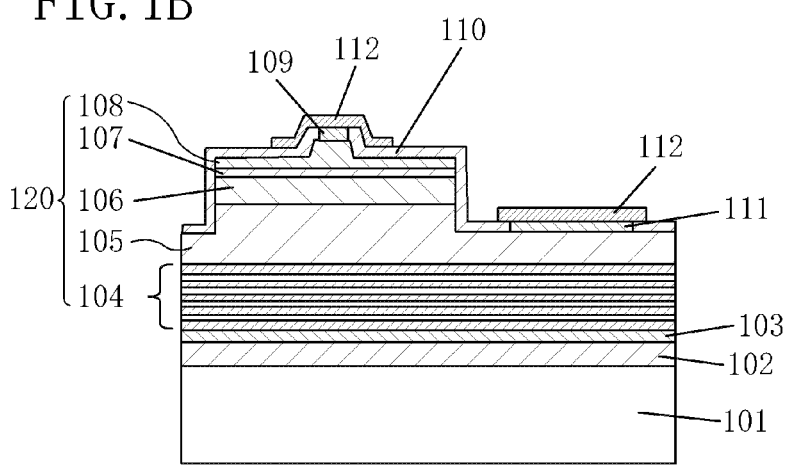
FIG. 1A
FIG. 1C
PLANE ORIENTATION OF GaN FORMED ON SOI
PLANE ORIENTATION OF Si THIN FILM OF TOP LAYER OF SOI
PLANE ORIENTATION OF Si OF SUBSTRATE OF SOI
⟨1-100⟩ DIRECTION OF GaN
⟨1-10⟩ DIRECTION OF Si THIN FILM OF TOP LAYER
⟨011⟩ DIRECTION OF Si OF SUBSTRATE
FIG. 1B FIG. 4A
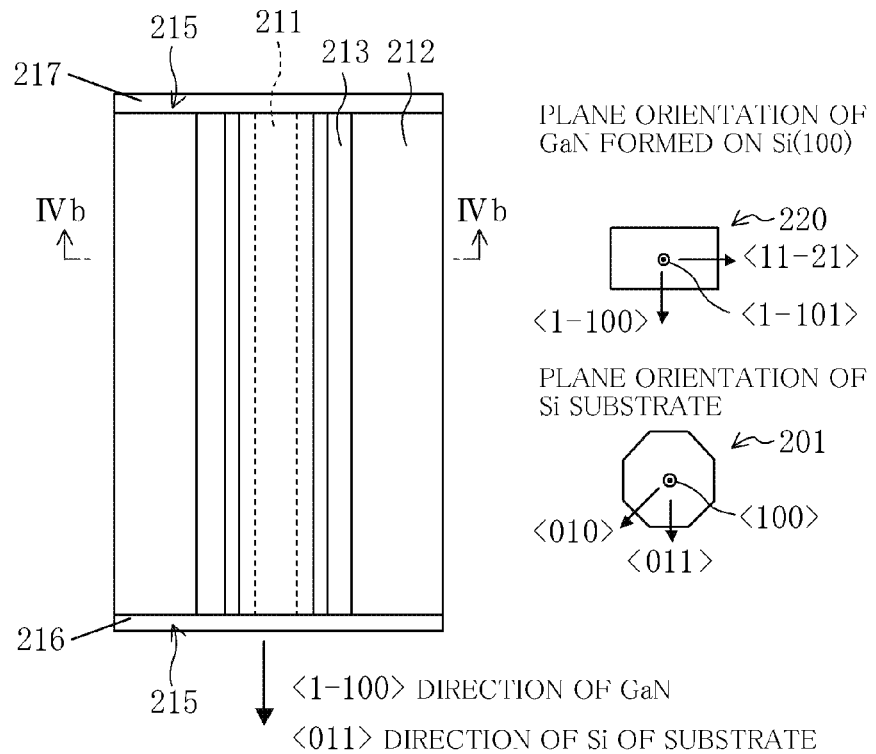
FIG. 4C
PLANE ORIENTATION OF GaN FORMED ON Si(100)
PLANE ORIENTATION OF Si SUBSTRATE
⟨1-100⟩ DIRECTION OF GaN
⟨011⟩ DIRECTION OF Si OF SUBSTRATE
FIG. 4B
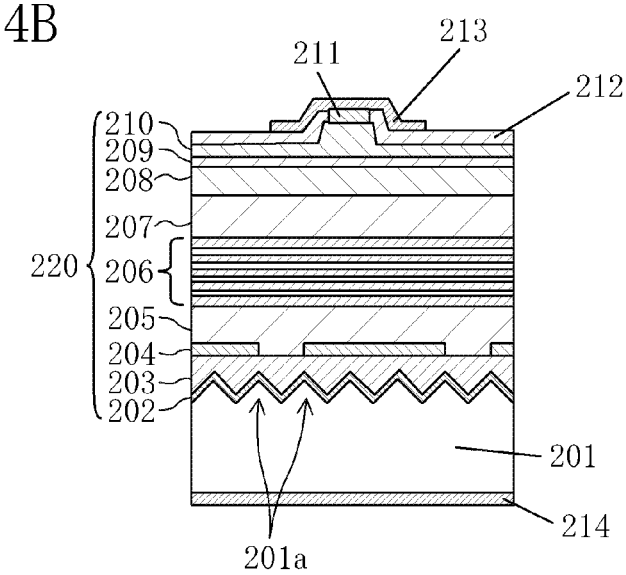

10 μm

NITRIDE SEMICONDUCTOR LASER DIODE

CROSS-REFERENCE TO RELATED APPLICATIONS

This application is a Continuation of U.S. application Ser. No. 11/979,877, filed on Nov. 9, 2007 now U.S. Pat. No. 7,664,151, claiming priority of Japanese Patent Application No. 2006-304139, filed on Nov. 9, 2006, the entire contents of each of which are hereby incorporated by reference.

BACKGROUND OF THE INVENTION

1. Technical Field

The present invention relates to a nitride semiconductor laser device applicable to a blue-violet semiconductor laser device used for a light source for writing and reading a high-density optical disk.

2. Related Art

A group III-V nitride compound semiconductor (generally expressed by InGaAlN) typified by gallium nitride (GaN) is a material having a wide forbidden band width (in the case of GaN, 3.4 eV at room temperature) and capable of realizing a light emitting device emitting light in the range of a wavelength from green to ultra-violet. Green/blue light emitting diodes have been commercialized and widely used in various displays and signalers. Moreover, a white light emitting diode that excites a fluorescent material by a blue light emitting diode or an ultra-violet light emitting diode to produce white light has been also commercialized and has been used as a liquid crystal backlight, for example.

It is a blue-violet laser device applicable to a light source for a next-generation high-density optical disk that is expected following the light emitting diodes as a new application field of a nitride compound semiconductor. Through the progression of research and development on epitaxial growth and the process technology of a device, the blue-violet laser device using the nitride compound semiconductor have reached to a level satisfying the specification of a next-generation optical disk typified by Blu-ray. A GaN-based blue-violet semiconductor laser device now reported and commercialized generally uses GaN for a substrate for epitaxial growth (see, for example, S. Nakamura et al., Jpn. J. Appl. Phys., Vol. 37 (1998) L309). This is because a substrate having less crystal defects is desired to improve reliability and because an excellent cleavage face is desired to secure a sufficiently excellent mirror reflectivity to thereby realize a low operating current.

However, a present available GaN substrate is manufactured not by a so-called bulk crystal growing method such as a pulling method but by a hydride vapor phase epitaxy (HVPE) method, so there is a limit in an improvement in throughput and in increasing an area. For this reason, the cost of the substrate is high and hence it is predicted that there will be a limit in reducing the cost of the GaN-based semiconductor laser device. Thus, to put a next-generation optical disk system using the GaN-based semiconductor laser device into widespread use, a reduction in the cost of the laser device is absolutely necessary.

A technology for epitaxial growth on a silicon (Si) substrate has received widespread attention as a technology for realizing a GaN-based device at a lower cost. The crystallinity of the GaN-based semiconductor has been greatly improved by improvements in a buffer layer technology or the like and, for example, a blue light emitting diode formed on a Si substrate has been reported (see, for example, T. Egawa et al., IEEE Electron Device Lett., Vol. 26 (2005), p. 169). If the technology of epitaxial growth on the Si substrate having a large area and produced at a low cost can be applied to a semiconductor laser structure, it is expected that the cost of a blue-violet semiconductor laser device can be drastically reduced.

Moreover, as a semiconductor laser device using a Si substrate is disclosed an example that selectively forms a groove having a V-shaped cross section on a principal surface of the Si substrate, the principal surface having a plane at an off angle of 7.3 degrees with respect to the (100) plane, and that epitaxially grows GaN in which the plane orientation of a principal surface is a (1-101) plane on the principal surface of the Si substrate to thereby construct a semiconductor laser structure (see, for example, Japanese Patent Unexamined Publication No. 2004-031657, hereinafter referred to it as Patent Document 1).

However, the epitaxial growth of the GaN-based semiconductor on the Si substrate in the related art has been entirely performed on a Si substrate in which the plane orientation of a principal surface is a (111) plane. When this is applied to the manufacture of a blue-violet semiconductor laser device, a cleavage face in a laser structure made of the GaN-based semiconductor becomes a (110) plane of Si and a plane equivalent to the (110) plane (for example, a plane equivalent to the (110) plane is hereinafter expressed by a {110} plane), the (110) plane of Si being slanted with respect to both of a (111) plane which is a plane orientation of a principal surface of the Si substrate and a (0001) plane which is a plane orientation of a principal surface of GaN or the like grown on the (111) plane. Thus, there is presented a problem that a cleavage face perpendicular to the principal surface of a laser structure cannot be obtained.

Furthermore, as described in Patent Document 1, when a GaN-based semiconductor is grown on a Si substrate in which the plane orientation of a principal surface is nearly a (100) plane, the Si substrate can be cleaved at a plane equivalent to a (110) plane, but the waveguide of a laser structure described in Patent Document 1 is presumed to have a <11-20> direction. For this reason, the cleavage face of the laser structure in this case is made a (11-20) plane. Thus, when considering the relationship of a crystal orientation between the Si substrate and the GaN-based semiconductor epitaxially grown on the Si substrate, the cleavage face of the laser structure in Patent Document 1 does not match with the cleavage face of the Si substrate, so a good cleavage face cannot be produced. In addition, the description relating to the cleavage face of a laser structure made of a Si substrate and a GaN-based semiconductor is not provided in Patent Document 1.

Hence, when a GaN-based semiconductor laser structure is manufactured by the epitaxial growth method in the related art on a Si substrate having a plane orientation of a (111) plane on a principal surface or on a Si substrate having a plane orientation of a (100) plane on a principal surface and having a groove, which has a V-shaped cross section, selectively formed thereon, a sufficiently large reflectivity cannot be acquired by a facet mirror formed on the cleavage face of a waveguide. As a result, it is difficult to obtain practical values as a threshold current and an operating current.

SUMMARY OF THE INVENTION

In view of the above-mentioned problems in the related art, the object of the present invention is to sufficiently increase the reflectivity of a facet mirror and to realize a low threshold current and a low operating current even if a substrate made of silicon for epitaxial growth is used for a semiconductor laser structure made of nitride semiconductor.

In order to achieve the above-mentioned object, the present invention epitaxially grows a semiconductor laminate made of nitride on a substrate made of silicon (Si) having a {100} plane as a plane orientation of a principal surface to thereby make a cleavage face of the substrate a {011} plane perpendicular to the {100} plane of Si and to make this {011} plane of Si parallel to a {1-100} plane of a cleavage face of GaN, thereby constructing a nitride semiconductor laser device.

Here, in the description of this application, a negative sign "-" attached to an index expressing a plane orientation or a direction of a crystallographic axis expresses a reverse of an index following the sign "-" for the sake of convenience.

Specifically, the nitride semiconductor laser device in accordance with the present invention is characterized by including: a substrate made of silicon in which a plane orientation of a principal surface is a {100} plane; and a semiconductor laminate that includes a plurality of semiconductor layers formed on the substrate and includes an active layer, each of the plurality of semiconductor layers being made of group III-V nitride, and is characterized in that the semiconductor laminate has a plane parallel to a {011} plane which is an plane orientation of silicon as a cleavage face, the cleavage face constructing a facet mirror.

The nitride semiconductor laser device in accordance with the present invention includes a substrate made of silicon in which a plane orientation of a principal surface is a {100} plane and a semiconductor laminate formed on the substrate has a cleavage face parallel to a {011} plane of a plane orientation of silicon. Since this cleavage face constructs an excellent facet mirror, although the nitride semiconductor laser device is manufactured by the use of an inexpensive silicon substrate, the nitride semiconductor laser device can realize a low threshold current and a low operating current.

In the nitride semiconductor laser device of the present invention, it is preferable that a plane orientation of a principal surface of the semiconductor laminate is a {0001} plane in gallium nitride.

With this construction, the semiconductor made of group III-V nitride can be cleaved perpendicularly to the principal surface by the {011} plane of Si, which is a cleavage face of the {100} plane of Si. Thus, an excellent cleavage face can be formed in the semiconductor laminate.

In the nitride semiconductor laser device of the present invention, it is preferable that the cleavage face of the semiconductor laminate is a {1-100} plane.

With this construction, the {011} plane of a cleavage face of the {100} plane of Si and the {1-100} plane of a cleavage face of the {0001} plane of GaN can be formed so as to be parallel to each other. Thus, a more excellent cleavage face can be realized.

It is preferable that the nitride semiconductor laser device of the present invention further includes a thin film formed between the substrate and the semiconductor laminate and made of silicon in which a plane orientation of a principal surface is a {111} plane and that the semiconductor laminate is epitaxially grown on a principal surface of the thin film.

With this construction, the crystallinity of the semiconductor laminate made of group III-V nitride can be further improved and hence excellent characteristics of, for example, a low threshold current and a high slope efficiency can be obtained.

In this case, it is preferable that the nitride semiconductor laser device of the present invention further includes an insulating film formed between the substrate and the thin film.

With this construction, a substrate for growing a crystal can be made an SOI substrate by the insulating film. In addition, the insulating film formed between the substrate and the thin film is smaller in a refractive index than silicon, so emitted light leaking on the substrate side can be easily confined in the semiconductor laminate.

In the nitride semiconductor laser device of the present invention, the thin film may contain hydrogen ions.

With this construction, a plate-shaped part made of silicon in which a plane orientation of a principal surface is a {111} plane and having hydrogen ions implanted into a specified depth is bonded to the substrate or the insulating film and then is subjected to heat treatment, whereby a region where the hydrogen ions are implanted is easily separated and hence the thin film can be formed into a thin film having a desired film thickness.

In the nitride semiconductor laser device of the present invention, it is preferable that the thin film is formed in such a way that a <1-10> direction of a crystallographic axis of the thin film coincides with a <011> direction of a crystallographic axis of the substrate.

With this construction, the cleavage face of the semiconductor laminate formed on the thin film is parallel to the cleavage face of the substrate, so a more excellent cleavage face can be formed on the semiconductor laminate.

In the nitride semiconductor laser device of the present invention, it is preferable that at least a part of the thin film is substituted by silicon carbide.

With this construction, since silicon carbide (SiC) is comparatively close to gallium nitride (GaN) in a lattice constant, a semiconductor laminate made of nitride having better crystallinity can be formed on the thin film in which at least a portion is made of SiC. As a result, excellent characteristics, for example, a low threshold current and a high slop efficiency can be realized.

In the nitride semiconductor laser device of the present invention, it is preferable that the substrate has indented and projected portions on its principal surface and that the semiconductor laminate is epitaxially grown on the indented and projected portions.

With this construction, when the indented and projected portions are constructed of plural facets each formed of the {111} plane of Si, epitaxial growth is produced from the facets. For this reason, the crystallinity of the semiconductor laminate formed on the substrate and made of nitride can be improved. Thus, a blue-violet semiconductor laser device having excellent characteristics, for example, a low threshold current and a high slope efficiency can be realized.

Thus, it is preferable that each of the indented and projected portions is constructed of a {111} plane that is a plane orientation of Si.

In the nitride semiconductor laser device of the present invention, it is preferable that when the substrate has the indented and projected portions on its principal surface, the plane orientation of a principal surface of the semiconductor laminate is a {1-101} plane in gallium nitride.

With this construction, the semiconductor laminate made of nitride has a flat surface and can realize excellent crystallinity. In addition, by the {1-101} plane, a polarized electric field resists being developed perpendicularly to the principal surface in the active layer and hence the so-called quantum Stark effect is prevented, so light emitting efficiency in the active layer can be improved. As a result, a blue-violet semiconductor laser device having excellent characteristics, for example, a low threshold current and a high slope efficiency can be realized.

In the nitride semiconductor laser device of the present invention, when the substrate has the indented and projected portions on its principal surface, it is preferable that a cleavage face of the semiconductor laminate is a {1-100} plane.

With this construction, the {011} plane which is a cleavage face of the {100} plane of Si and the {1-100} plane which is a cleavage face of the {1-101} plane of GaN can be formed so as to be parallel to each other. Thus, a more excellent cleavage face can be realized.

In the nitride semiconductor laser device of the present invention, it is preferable that the semiconductor laminate has a stripe-shaped waveguide structure extending perpendicularly to the cleavage face and that the waveguide structure being formed so as to be located above one indented portion of the indented and projected portions.

With this construction, laser can be emitted without being affected by a region including crystal defects produced when the semiconductor laminates grown from plural facets are integrated with each other, so a blue-violet semiconductor laser device having high reliability can be realized.

In the nitride semiconductor laser device of the present invention, it is preferable that the semiconductor laminate has electric conductivity in a portion formed between the active layer and the substrate and that an electrode is formed on a plane opposite to the semiconductor laminate in the substrate.

With this construction, the electrode is formed also on the rear surface of the substrate, so a chip area can be further decreased and hence the cost can be further reduced.

In the nitride semiconductor laser device of the present invention, it is preferable that the semiconductor laminate has a periodic structure formed between the active layer and the substrate and formed of a first semiconductor layer and a second semiconductor layer which are different from each other in a composition and in a refractive index and are alternately laminated, the periodic structure being constructed so as to increase reflectivity of emitted light emitted from the active layer.

With this construction, the periodic structure formed between the active layer and the substrate functions as a part of the clad layer in the semiconductor laser device, so the thickness of the intrinsic clad layer can be reduced. For this reason, the film thickness of the semiconductor laminate formed on the substrate can be decreased, which in turn can prevent the occurrence of clacks in the semiconductor laminate. As a result, a blue-violet semiconductor laser device having higher performance and higher reliability can be realized. Further, the time required to grow the crystal of the semiconductor laminate can be shortened. Hence, a blue-violet semiconductor laser device can be manufactured at lower cost.

In this case, it is preferable that each of the first semiconductor layer and the second semiconductor layer has a thickness of one fourth of an optical wavelength corresponding to a wavelength of the emitted light.

With this construction, the periodic structure constructs a distributed Bragg reflector (DBR) mirror and can increase the reflectivity, which in turn can improve a light confining efficiency in the active layer. As a result, the threshold current can be further reduced.

In this case, it is preferable that the first semiconductor layer is made of aluminum nitride and that the second semiconductor layer is made of gallium nitride.

With this construction, the reflectivity in the periodic structure can be increased and the stress caused by a lattice mismatch and a difference in the coefficient of thermal expansion between the substrate and the semiconductor laminate can be relaxed. With this, the cracks produced in the semiconductor laminate can be prevented and hence a blue-violet semiconductor laser device having higher performance and higher reliability can be realized.

In the nitride semiconductor laser device of the present invention, it is preferable that the semiconductor laminate has a stripe-shaped waveguide structure, which is formed between the active layer and the substrate and has a mask film having a plurality of apertures and is epitaxially grown selectively from the respective apertures of the mask film and is extended perpendicularly to the cleavage face and that the waveguide structure is formed so as to be located above a region except for the apertures of the mask film.

With this construction, the semiconductor laminate is grown in a lateral direction on the mask film, so a portion grown in the lateral direction on the mask film in the semiconductor laminate has crystal defects decreased. Hence, a blue-violet semiconductor laser device having higher performance and higher reliability can be realized.

As described above, according to the nitride semiconductor laser device in accordance with the present invention, the cleavage face which constructs the excellent facet mirror can be formed in the semiconductor laminate made of III-V nitride and formed on the substrate made of silicon in which the plane orientation of the principal surface is the {100} plane. Thus, although the nitride semiconductor laser device is manufactured by the use of the inexpensive silicon substrate, the nitride semiconductor laser device can realize a low threshold current and a low operating current. With this, the cost of the blue-violet semiconductor laser can be reduced.

BRIEF DESCRIPTION OF THE DRAWINGS

FIG. 1A and FIG. 1B show a nitride semiconductor laser device according to a first embodiment of the present invention. FIG. 1A shows a plan view and FIG. 1B shows a sectional view along a line Ib-Ib in FIG. 1A. FIG. 1C shows schematic diagrams showing the respective plane orientations and the directions of the respective cleavage faces of a substrate, a thin film, and a semiconductor laminate.

FIGS. 4A and 4B show a nitride semiconductor laser device in accordance with a second embodiment of the present invention. FIG. 4A shows a plan view and FIG. 4B shows a sectional view along a line IVb-IVb in FIG. 4A. FIG. 4C shows schematic diagrams showing the respective plane orientations and the directions of the respective cleavage faces of a substrate and a semiconductor laminate.

DESCRIPTION OF THE PREFERRED EMBODIMENTS

First Embodiment

Figure 2A:
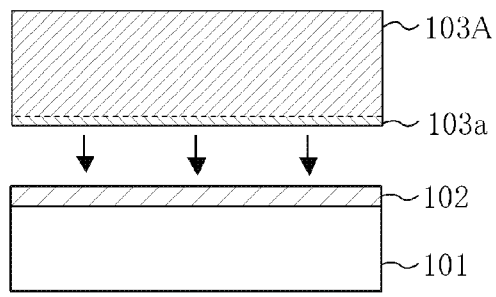
FIGS. 2A to 2F are sectional views, in the order of process, showing a method for manufacturing a nitride semiconductor laser device according to the first embodiment of the present invention.

A first embodiment of the present invention will be described with reference to the drawings.

FIG. 1A and FIG. 1B show a nitride semiconductor laser device according to the first embodiment of the present invention. FIG. 1A shows a plan construction and FIG. 1B shows a section construction along a line Ib-Ib in FIG. 1A.

As shown in FIG. 1A and FIG. 1B, the nitride semiconductor laser device according to the first embodiment of the present invention is constructed of: a so-called SOI (Silicon-On-Insulator) substrate including a substrate 101 made of silicon (Si) in which the plane orientation of a principal surface is a {100} plane, an insulating film 102 formed of silicon oxide ($SiO_2$) on the substrate 101 in a film thickness of about 100 nm, and a thin film 103 formed on the insulating film 102, having a film thickness of about 10 nm, and made of Si in which the plane orientation of a principal surface is a {111} plane; and a semiconductor laminate 120 including plural semiconductor layers which are formed on the SOI substrate and each of which is made of group III-V nitride.

The semiconductor laminate 120 is constructed of the following layers formed in succession on the SOI substrate, that is, on the thin film 103. The layers include: a periodic structure 104 formed of an initial layer made of aluminum nitride (AlN) and about twenty alternately laminated layers of first layers made of AlN and second layers made of gallium nitride (GaN); an n-type GaN layer 105; an n-type clad layer 106 made of n-type aluminum gallium nitride (AlGaN); a multiple quantum well (MQW) active layer 107 made of indium gallium nitride (InGaN); and a p-type clad layer 108 made of p-type AlGaN.

A stripe-shaped ridge (ridge stripe) part is formed at the top of the p-type clad layer 108 and an ohmic p-side electrode 109 made of palladium (Pd)/platinum (Pt)/gold (Au) is formed on the stripe-shaped ridge part. Moreover, a block layer 110 made of silicon oxide ($SiO_2$) is formed on both sides of the ridge part and in the regions of both sides thereof. Here, the ridge part and a region below the ridge part in the semiconductor laminate 120 functions as a waveguide of the semiconductor layer device.

In one side portion of the ridge part in the semiconductor laminate 120, the p-type clad layer 108, the MQW active layer 107, and the n-type clad layer 106 are selectively removed, whereby the n-type GaN layer 105 is exposed. An ohmic n-side electrode 111 made of titan (Ti)/aluminum (Al)/nickel (Ni)/gold (Au) is formed on the exposed portion of this n-type GaN layer 105. The p-side electrode 109 and the n-side electrode 111 are covered with a pad electrode 112 made of Ti/Au, respectively. Here, it is preferable that an Au layer in the pad electrode 112 is formed as a gold-plated layer.

As shown in FIG. 1A, the semiconductor laminate 120 is cleaved at a cleavage face 113 and has a resonance mirror (facet mirror) formed thereon. Further, a light emitting plane at the cleavage face 113 is covered with a low-reflecting coating film 114 and a rear plane opposite to the light emitting plane is covered with a high-reflecting coating film 115. In this manner, a blue-violet semiconductor laser device is constructed.

In FIG. 1C, the respective plane orientations of the substrate 101 and the thin film 103, which construct the SOI substrate, and the respective plane orientations of the semiconductor laminate 120, which is grown epitaxially on the thin film 103 and is made of GaN-based semiconductor, are shown as the directions of crystal axes. As shown in FIG. 1C, in the first embodiment, the semiconductor laminate 120 is formed in such a way that a {1-100} plane of a cleavage face thereof and a {011} plane of a cleavage face of the substrate 101 are parallel to each other. In other words, the semiconductor laminate 120 is cleaved in such a way that the {1-100} plane of GaN parallel to the {011} plane of a cleavage face of the substrate 101 becomes the cleavage face 113, whereby a resonance mirror is formed. The positional relationship of these plane orientations can be obtained by making the <1-10> direction of a crystallographic axis in the thin film 103, which is formed between the substrate 101 and the semiconductor laminate 120 and in which the plane orientation of a principal surface is a {111} plane, coincide with a direction perpendicular to the {011} plane of the cleavage face of the substrate 101 (that is, the <011> direction of the crystallographic axis). Here, in the relationship between the plane orientation and the direction of the crystallographic axis, a direction normal to a crystal plane having a certain plane orientation becomes the direction of the crystallographic axis of the crystal plane.

With this construction, the following problem presented by the related art can be solved: that is, in the related art, when the semiconductor laminate 120 having a laser structure is epitaxially grown on a Si substrate in which the plane orientation of a principal surface is a {111} plane, the cleavage face 113 of the semiconductor laminate 120 is not made perpendicular to the {0001} plane of GaN but is made slanted thereto because of the effect of the {111} plane of Si.

In the first embodiment, the {011} plane perpendicular to the {100} plane in the substrate 101 made of Si is made the cleavage face of the substrate 101, and this cleavage face is arranged in parallel to a {1-100} plane, which is the cleavage face 113 of the semiconductor laminate 120 and is perpendicular to the {0001} plane, whereby the excellent cleavage faces 113 can be formed in a laser structure formed on the substrate 101.

In this regard, an n-type guide layer and a p-type guide layer, which are made of GaN and can perform light confining control in the MQW active layer 107 with more accuracy, may be formed respectively between the n-type clad layer 106 and the MQW active layer 107 and between the p-type clad layer 108 and the MQW active layer 107.

Moreover, an electron barrier layer made of p-type AlGaN, which has a comparatively high composition of Al and can suppress the overflow of electrons to decrease a threshold current, may be formed between the p-type clad layer 108 and the MQW active layer 107.

Further, in order to reduce an electrode contact resistance in the p-side electrode 109, a contact layer made of p-type GaN may be formed between the p-type clad layer 108 and the p-side electrode 109.

Still further, in the first embodiment, in order to relax stress in the semiconductor laminate 120 made of nitride and epitaxially grown on the thin film 103 made of Si, the number of periods of periodic structures in the periodic structure 104 made of AlN/GaN is determined to be twenty. However, the thicknesses of the respective layers of the first layer made of AlN and the second layer made of GaN and the number of periods of the periodic structures need to be optimized according the laser structure formed on the periodic structure 104. Here, as an example, it is preferable to employ a construction that the thickness of the first layer made of AlN is 5 nm and that the thickness of the second layer made of GaN is 20 nm.

Still further, the thicknesses of the first layer and the second layer may be respectively set to one fourth of an optical wavelength corresponding to 405 nm, which is the wavelength of light emitted by the blue-violet semiconductor laser device according to this embodiment, to thereby increase a reflectivity in the periodic structure 104. This can increase a light confining effect in the MQW active layer 107. Thus, when the construction that the reflectivity of the periodic structure 104 is increased is employed, the n-type GaN layer 105 between the n-type clad layer 106 and the periodic structure 104 can be omitted. When the n-type GaN layer 105 is omitted in this manner, the film thickness of the semiconductor laminate 120 constructing the laser structure can be decreased, which in turn can decrease the occurrence of cracks in the semiconductor laminate 120.

Still further, although AlN is used for the initial layer of the periodic structure 104, the initial layer is not necessarily made of AlN. For example, the initial layer may be made of silicon carbide (SiC) by a chemical vapor deposition (CVD) method and further may be made of a SiC film formed by carbonizing the thin film 103 made of Si by the use of a hydrogen carbide gas. SiC is comparatively close to GaN in a lattice constant and hence can form a laser structure having excellent crystallinity like AlN.

In general, in order to improve the reliability of a semiconductor laser, crystal defects need to be decreased. For the purpose of further decreasing the crystal defects, the crystal growth of the n-type GaN layer 105 is interrupted once and a mask film having an aperture parallel to the ridge part (waveguide) in the semiconductor laminate 120 and, for example, made of $SiO_2$ is formed and then the semiconductor laminate 120 following the n-type GaN layer 105 is epitaxially grown on the mask film. With this, the semiconductor laminate 120 is grown selectively in a lateral direction on the mask film made of a dielectric material, which can reduce crystal defects greatly. Thus, when the ridge part is formed on a region grown in the lateral direction in the semiconductor laminate 120, the reliability of the semiconductor laser device can be improved drastically.

As described above, in the first embodiment, the plane orientation of the principal surface of the substrate 101 which has an effect on the plane orientation of the cleavage face 113 of the semiconductor laminate 120 made of group III-V nitride is made the {100} plane and the {011} plane perpendicular to the {100} plane is made the cleavage face of the substrate 101. Further, the {011} plane of the cleavage face of the substrate 101 is arranged in parallel to the {1-100} plane, which is the cleavage face 113 in the semiconductor laminate 120 having a {0001} plane as the plane orientation of its principal surface and is perpendicular to the {0001} plane, whereby the excellent cleavage face 113 can be formed in the laser structure formed on the substrate 101 made of Si.

In this manner, it is possible to realize the nitride semiconductor laser device, which is made of not an expensive GaN substrate having a small wafer diameter but an inexpensive Si substrate and has an excellent cleavage face, the GaN substrate being used in a conventional nitride semiconductor laser device. Thus, it is possible to decrease the cost of a nitride semiconductor laser device capable of emitting blue-violet light.

A method for manufacturing the nitride semiconductor laser device constructed in the above-mentioned manner will be described with reference to the drawings.

FIGS. 2A to 2F show the sectional constructions, in the order of process, of a method for manufacturing a nitride semiconductor laser device in accordance with a first embodiment of the present invention.

First, as shown in FIG. 2A, the insulating film 102 made of $SiO_2$ and having a film thickness of about 100 nm is formed on the principal surface of the substrate 101, which is made of silicon (Si) in which the plane orientation of the principal surface is the {100} plane, by a thermal oxidation method, for example. A thin film forming substrate 103A made of Si in which the plane orientation of a principal surface is the {111} plane is prepared in addition to the formation of the insulating film 102, and hydrogen ions are implanted into a shallow region of a depth of about 10 nm or less from the principal surface of the prepared thin film forming substrate 103A to form a hydrogen ion implanted region 103a in the thin film forming substrate 103A. Subsequently, the insulating film 102 on the substrate 101 is bonded to the hydrogen ion implanted region 103a of the thin film forming substrate 103A.

Figure 2B:
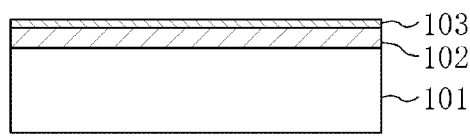

Next, as shown in FIG. 2B, the thin film forming substrate 103A bonded to the insulating film 102 on the substrate 101 is subjected to high temperature heat treatment, whereby only the hydrogen ion implanted region 103a of the thin film forming substrate 103A can be selectively separated. In this manner, the thin film 103 made of Si in which the plane orientation of the principal surface is the {111} plane can be formed on the insulating film 102 of the substrate 101. This thin film forming method is referred to as the so-called smart cut method and can form the thin film 103 on the substrate 101, the thin film 103 having an extremely thin film thickness and being made of Si in which the plane orientation of the principal surface is the {111} plane, the substrate 101 being made of Si in which the plane orientation of the principal surface is the {100} plane. Here, as described above, the thin film 103 made of Si is bonded to the substrate 101 in such a way that the {011} plane of the cleavage face of the substrate 101 is perpendicular to a <1-10> direction in the crystallographic axis of the thin film 103. As a result, when the semiconductor laminate 120 is epitaxially grown on the thin film 103, the cleavage face of the substrate 101 is made parallel to the {1-100} plane of the cleavage face of GaN. In this manner, it is preferable that the film thickness of the thin film 103 made of Si is 10 nm or less. By thinning the film thickness of the thin film 103 in this manner as much as possible, the effect produced by the cleavage face, which is produced in the thin film 103 and is cleaved in a direction slanted to the {100} plane of Si, can be minimized. For this reason, the more excellent cleavage face can be formed in the semiconductor laminate 120.

Figure 2C:
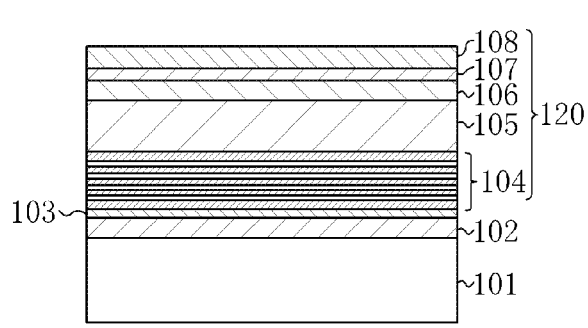

Next, as shown in FIG. 2C, the initial layer made of AlN, the periodic structure 104 made of about 20 periods of laminate made of AlN/GaN, the n-type GaN layer 105, the n-type clad layer 106 made of n-type AlGaN, the MQW active layer 107 made of InGaN, and the p-type clad layer 108 made of p-type AlGaN are epitaxially grown in succession on the thin film 103 by a metal organic chemical vapor deposition (MOCVD) method, whereby the semiconductor laminate 120 is formed. Here, the n-type semiconductor layer is doped with Si of an n-type dopant by adding, for example, a silane ($SiH_4$) gas to a raw material gas at the time of epitaxial growth. Moreover, the p-type semiconductor layer is doped with Mg of a p-type dopant by adding, for example, a cyclopentadienyl magnesium ($Cp_2Mg$) gas to the raw material gas at the time of epitaxial growth. Blue-violet light having a wavelength of 405 nm is emitted from the MQW active layer 107 by passing current through the device. The periodic structure 104, as described above, is formed so as to reduce stress caused in the semiconductor laminate 120, and the thicknesses of the respective layers and the number of periods of the periodic structure 104 are optimized.

Figure 2D:
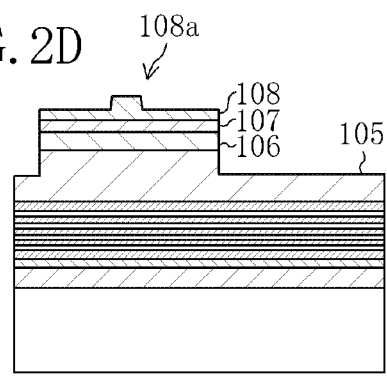

Next, as shown in FIG. 2D, a ridge part 108a, which extends in the shape of a stripe in a direction parallel to the <1-100> direction of the crystallographic axis in the semiconductor laminate 120 and has a width of from 1 µm to 2 µm and has a convex cross section, is formed at the top of the p-type clad layer 108. The occurrence of a kink in the optical output characteristics of the semiconductor laser device can be prevented by the width of the stripe. Here, the stripe-shaped ridge part 108a can be formed by masking a ridge forming region at the top of the p-type clad layer 108, for example, by the use of a resist pattern and by an inductively coupled plasma (ICP) etching method using a chlorine ($Cl_2$) gas. Subsequently, to form the n-side electrode, the side region of the ridge part 108a in the semiconductor laminate 120 is etched by the same etching method to expose the n-type GaN layer 105 selectively.

Figure 2E:
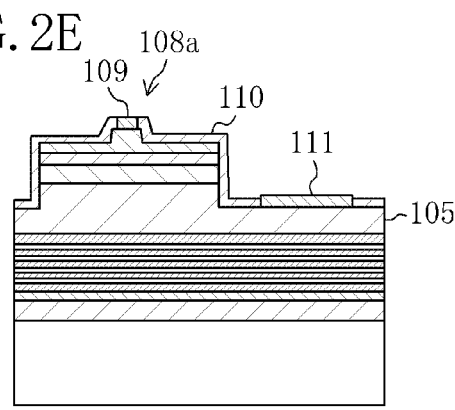

Next, as shown in FIG. 2E, a block layer 110 made of $SiO_2$ and having a film thickness of 200 nm is formed on the semiconductor laminate 120, which has the ridge part 108a formed thereon and has the n-type GaN layer 105 exposed, by a CVD method using, for example, a $SiH_4$ gas and a $O_2$ gas as raw material gases. Subsequently, apertures are formed in the block layer 110 at an upper portion of the ridge part 108a and at the n-side electrode forming region of the n-type GaN layer 105. Subsequently, Pd/Pt/Au is deposited in the aperture formed at the upper portion of the ridge part 108a in the block layer 110 by an electron beam deposition method and then the unnecessary portion of the deposited metal film and the resist pattern are removed together by using a lift-off method, thereby forming the p-side electrode 109. Moreover, the n-side electrode 111 is formed by depositing Ti/Al/Ni/Au in the aperture formed in the n-side electrode forming region in the block layer 110 by the electron beam deposition method and then by using the lift-off method.

Figure 2F:
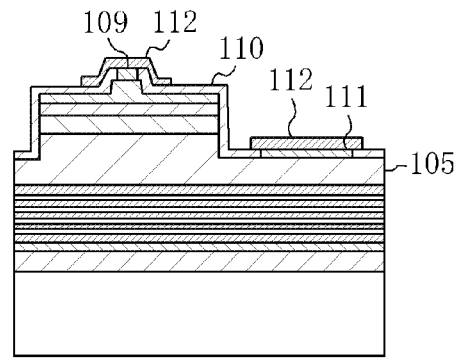

Next, as shown in FIG. 2F, the pad electrode 112 made of Ti/Au is formed so as to cover the p-side electrode 109 and the n-side electrode 111 respectively. Here, a Au layer in the pad electrode 112 preferably has a comparatively large thickness for wire bonding and is formed by gold plating, for example.

As described above, according to the method for manufacturing a blue-violet semiconductor laser device in accordance with the first embodiment, the plane orientation of the principal surface of the substrate 101 is made the {100} plane and the {011} plane perpendicular to the {100} plane is made the cleavage face of the substrate 101. Further, the {011} plane of the cleavage face of the substrate 101 is arranged so as to be parallel to the {1-100} plane, which is the cleavage face in the semiconductor laminate 120 having the {0001} plane as the plane orientation of the principal surface and which is perpendicular to the {0001} plane, whereby the excellent cleavage face can be formed in the laser structure formed on the substrate 101 made of Si.

With this, the nitride semiconductor laser device having the excellent cleavage face can be realized by the use of the inexpensive large-area Si substrate. Hence, a reduction in the cost of the nitride semiconductor laser device can be realized.

One Modification of the First Embodiment

Figure 3:
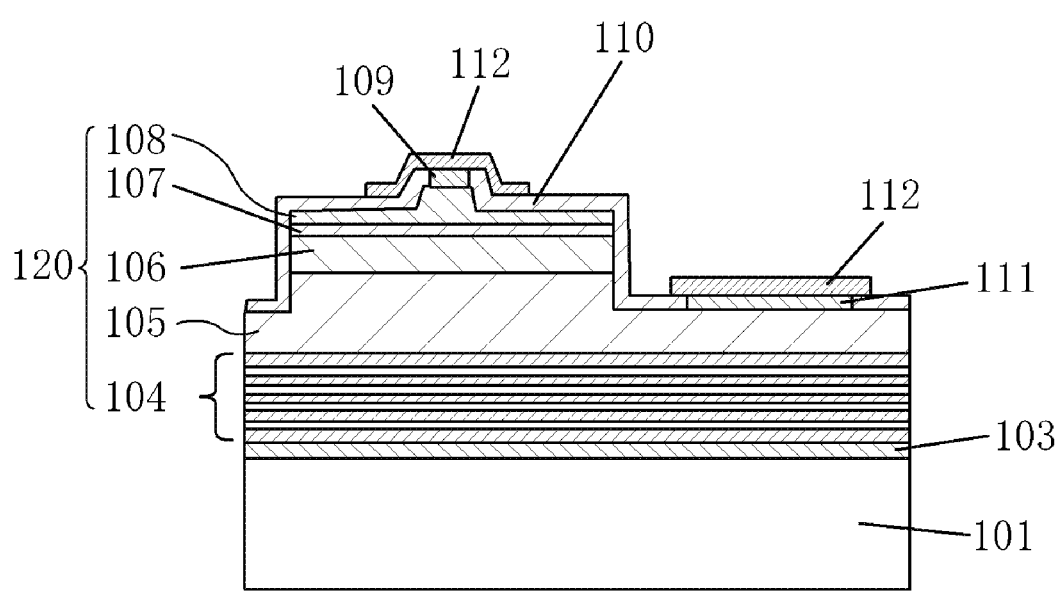
FIG. 3 is a sectional view showing a nitride semiconductor laser device in accordance with a modification of the first embodiment of the present invention.

FIG. 3 shows the sectional construction of a nitride semiconductor laser device in accordance with one modification of the first embodiment of the present invention. In FIG. 3, the same constituent parts as the constituent parts shown in FIG. 1B are denoted by the same reference symbols and their descriptions will be omitted.

As shown in FIG. 3, in the nitride semiconductor laser device in accordance with this modification, the thin film 103 made of Si in which the plane orientation of the principal surface is the {111} plane is formed directly on the principal surface of the substrate 101 made of Si in which the plane orientation of the principal surface is the {100} plane without the insulating film 102.

Here, just as with the first embodiment, the thin film 103 can be formed by the smart cut method, for example.

According to this modification, a process for forming the insulating film 102 on the principal surface of the substrate 101 can be omitted In this regard, in the first embodiment, the insulating film 102 made of silicon oxide is formed between the substrate 101 and the thin film 103. However, when the insulating film 102 is formed on the substrate 101, the effect of confining light emitted from the MQW active layer 107 in the semiconductor laminate 120 can be expected to be produced.

Second Embodiment

A second embodiment of the present invention will be described below with reference to the drawings.

FIGS. 4A and 4B show a nitride semiconductor laser device in accordance with the second embodiment of the present invention. FIG. 4A shows a plan construction and FIG. 4B shows a sectional construction along a line IVb-IVb in FIG. 4A.

As shown in FIG. 4B, in the nitride semiconductor laser device in accordance with the second embodiment, indented and projected portions 201a made of plural facets of {111} planes are formed on the principal surface of a substrate 201 made of n-type silicon (Si) in which the plane orientation of a principal surface is a {100} plane and a semiconductor laminate 220 made of group III-V nitride semiconductor is formed on the indented and projected portions 201a to construct a blue-violet semiconductor laser device.

Further, as shown in FIG. 4C, the {011} plane of the cleavage face of the substrate 201 is formed so as to be parallel to the {1-100} plane of the cleavage face of the semiconductor laminate 220.

Specifically, as shown in FIG. 4B, the indented and projected portions 201a made of facets in which a plane orientation is a {111} plane are formed on the principal surface of the substrate 201 and an initial layer 202 made of n-type AlN and a first n-type GaN layer 203 are formed on the indented and projected portions 201a. Here, the plane orientation of the principal surface of the semiconductor laminate 220 epitaxially grown from the facets in which a plane orientation is the {111} plane becomes a {1-101} plane.

A stripe-shaped mask film 204 having plural apertures and made of $SiO_2$, for example, are formed in the first n-type GaN layer 203 whose top surface is grown into a flat shape. A second n-type GaN layer 205 is formed in the respective apertures of the mask film 204 by epitaxial growth. Here, the second n-type GaN layer 205 has lateral grow accelerated on the mask film 204 and hence has crystal defects substantially decreased.

A periodic structure 206 made of n-type AlN/n-type GaN, a third n-type GaN layer 207, an n-type clad layer made 208 made of n-type AlGaN, a multiple quantum well (MQW) active layer 209 made of InGaN, and a p-type clad layer 210 made of p-type AlGaN are formed in succession by epitaxial growth on the second n-type GaN layer 205 having crystal defects substantially decreased.

The plane orientation of the principal surface of the MQW active layer 209 is also the {1-101} plane and hence a polarized electric field produced perpendicularly to the principal surface is prevented, so the MQW active layer 209 resists being affected by the so-called quantum Stark effect. This can improve the light emission efficiency in the MQW active layer 209 and hence can reduce the threshold current of the semiconductor laser device and can improve the slope efficiency.

A stripe-shaped ridge part is formed at the top of the p-type clad layer 210 and an ohmic p-side electrode 211 made of Pd/Pt/Au is formed on the ridge part. Moreover, a block layer 212 made of $SiO_2$ is formed on both sides of the ridge part and in their both side regions. Here, the ridge part and a region below the ridge part in the semiconductor laminate 220 function as the waveguide of the semiconductor laser device. The p-side electrode 211 is covered with a pad electrode 213 made of Ti/Au and a Au layer is formed as a gold-plated layer. Moreover, an ohmic n-side electrode 214 made of AuSb/Au is formed as a reverse electrode on a surface opposite to the semiconductor laminate 220 in the substrate 201 made of n-type Si.

In this manner, in the nitride semiconductor laser device in accordance with the second embodiment, the construction that silicon (Si) in which the plane orientation of the principal surface is the {100} plane is used for the substrate 201 is the same as the construction in the first embodiment. However, in place of forming the substrate 201 in an SOI structure, the semiconductor laminate 220 including a semiconductor laser structure is epitaxially grown directly on the indented and projected portions 201a made of plural facets each having the {111} plane. With this, the second embodiment is different from the first embodiment in that the principal surface of the semiconductor laminate 220 becomes the {1-101} plane and in that the conduction type of the lower portion of the MQW active layer 209 in the semiconductor laminate 220 including the substrate 201 is made an n type to form a structure in which current passes in a direction perpendicular to the substrate 201 to thereby decrease the chip area of the laser device.

Figure 5:
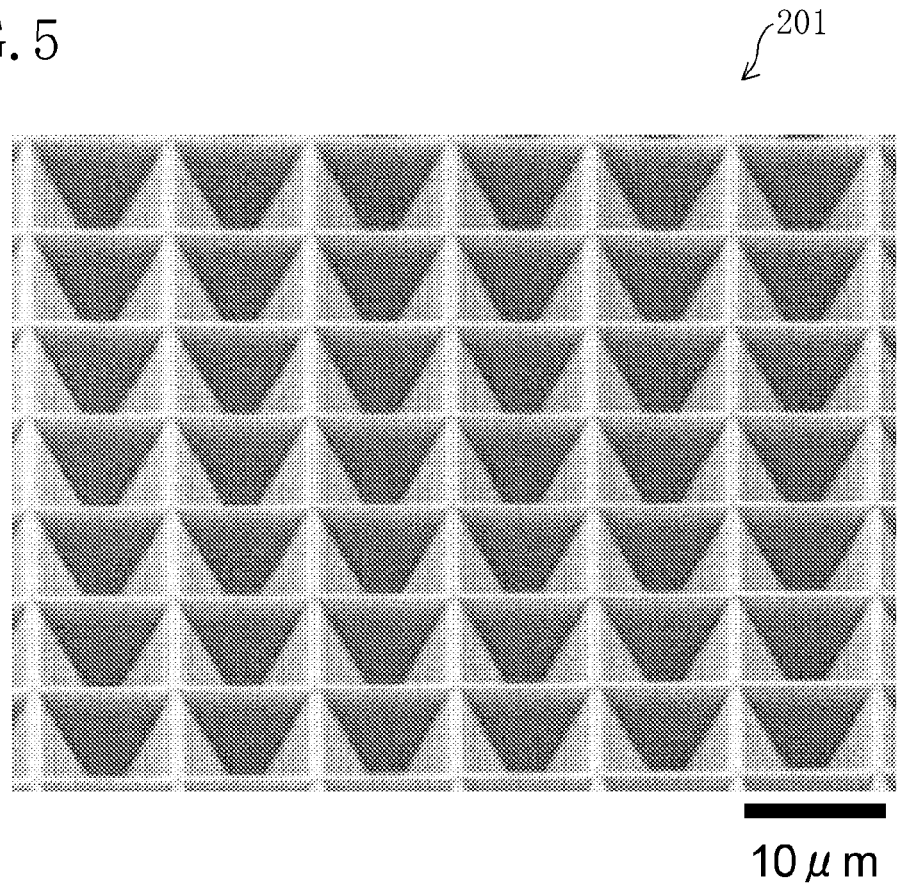
FIG. 5 is a photograph, taken by a scanning electron microscope (SEM), of indented and projected portions formed on the principal surface of the substrate in accordance with the second embodiment of the present invention.
Figure 6:
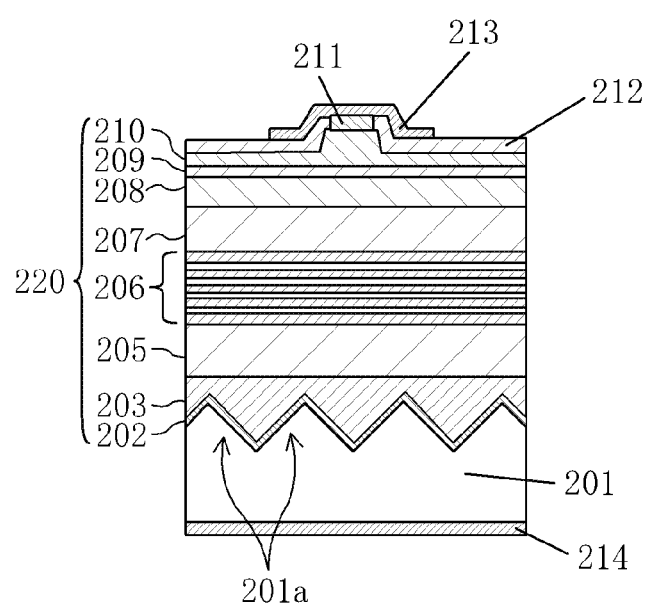
FIG. 6 is a sectional view showing a nitride semiconductor laser device in accordance with a modification of the second embodiment of the present invention.

In this regard, the indented and projected portions 201a formed on the principal face of the substrate 201 may be formed in the shape of a stripe and, as shown by a photograph in FIG. 5, may be formed, for example, in a construction in which micro inverse pyramids are arranged in a matrix. The spacings of the indented and projected portions 201a may be, for example, 1 μm or less so as to realize excellent epitaxial growth. Further, as shown in FIG. 6, the spacings of the indented and projected portions 201a may be, for example, 10 μm or more so as to become larger than the width of the ridge part larger. Moreover, as shown in FIG. 6, a construction may be employed in which the spacings of the indented and projected portions 201a is, for example, 10 μm or more so as to become larger than the width of the ridge part and in which the mask film 204 is not formed. In the case of this construction, a waveguide part of a semiconductor laser structure can be completely included in a region above one V-shaped groove. Thus, the density of crystal defects is reduced in the region above this one V-shaped groove, so it is not necessary to use lateral growth by the mask film 204.

Additionally, in the second embodiment has been shown a case in which the principal surface of the semiconductor laminate 220 is the {1-101} plane, but depending on the condition of the epitaxial growth, the {0001} plane of GaN can be also formed. Here, when the principal surface of the semiconductor laminate 220 is made a {0001} plane, the indented and projected portions 201a are not necessarily formed on the principal surface of the substrate 201. Moreover, even when the principal surface of the semiconductor laminate 220 is the {0001} plane, a {1-100} plane of a cleavage face 215 becomes parallel to the cleavage face of the substrate 201. The semiconductor laminate 220 is cleaved along the cleavage faces 215 arranged in this manner to form a resonance mirror and, of both of the cleavage faces 215, a light emitting plane is covered with a low-reflecting coating film 216 and a rear plane opposite to the light emitting plane is covered with a high-reflecting coating film 217. In this manner, a blue-violet semiconductor laser device can be realized.

By the use of this construction, just as with the first embodiment, the {011} plane perpendicular to the {100} plane in the substrate 201 made of n-type Si is made the cleavage face of the substrate 201, and this cleavage face is arranged parallel to the {1-100} plane, which is the cleavage face 215 of the semiconductor laminate 220 and is perpendicular to the {1-101} plane, whereby the excellent cleavage faces 215 can be formed in the laser structure formed on the substrate 201.

In this regard, in the semiconductor laminate 220 constructing the semiconductor laser structure, just as with the first embodiment, a guide layer which sandwiches the MQW active layer 209 in a vertical direction and which is made of p-type GaN or n-type GaN may be formed; an electron barrier layer made of p-type AlGaN having a comparatively high composition of Al may be formed between the p-type clad layer 210 and the MQW active layer 209; and a contact layer made of p-type GaN may be formed on the p-type clad layer 210.

Further, the thicknesses and compositions of the respective layers constructing the periodic structure 206 made of n-type AlN/n-type GaN may be designed appropriately to increase reflectivity in the periodic structure 206 and the third n-type GaN layer 207 under the n-type clad layer 208 may be not formed.

Still further, while the n-type AlN is used for the initial layer 202, a silicon carbide (SiC) layer formed by the CVD method may be used or a SiC layer formed by carbonizing a Si layer may be used.

Still further, in the nitride semiconductor laser device in accordance with the second embodiment, the laser structure included in the semiconductor laminate 220 is grown in the lateral direction by the mask layer 204 made of $SiO_2$ and the ridge part (waveguide) is arranged on the region grown in the lateral direction. This can greatly improve the reliability of the blue-violet semiconductor laser device.

As described above, according to the blue-violet semiconductor laser device in accordance with the second embodiment, the substrate 201 in which the plane orientation of the principal surface is the {100} plane is used and the {011} plane perpendicular to the {100} plane is made the cleavage face of the substrate 201. Further, the {011} plane of the cleavage face of the substrate 201 is arranged in parallel to the {1-100} plane which is the cleavage face 215 in the semiconductor laminate 220 having the {1-101} plane as the plane orientation of the principal surface and which is perpendicular to the {1-101} plane. With this, the excellent cleavage faces 215 can be formed in the laser structure formed on the substrate 201 made of Si.

In this manner, the nitride semiconductor laser device having the excellent cleavage faces can be realized by the use of the inexpensive large-area Si substrate, so a reduction in the cost of the blue-violet semiconductor laser device can be realized.

A method for manufacturing a nitride semiconductor laser device constructed in the above-mentioned manner will be described with reference to the drawings.

FIGS. 7A to 7F show the sectional constructions, in the order of the process, of the method for manufacturing a nitride semiconductor laser device in accordance with the second embodiment of the present invention.

Figure 7A:
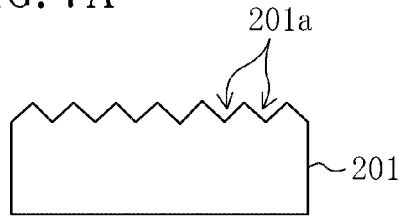
FIGS. 7A to 7F are sectional views, in the order of the process, showing a method for manufacturing a nitride semiconductor laser device in accordance with the second embodiment of the present invention.

First, as shown in FIG. 7A, a mask pattern (not shown) having a stripe-shaped pattern or a lattice-shaped pattern is formed on the principal surface of the substrate 201 made of n-type silicon (Si) in which the plane orientation of the principal surface is the {100} plane, and the principal surface of the substrate 201 is wet etched by the use of the formed mask pattern and an alkaline solution such as potassium hydroxide (KOH). The indented and projected portions 201a constructed of only facets each having the plane orientation of the {111} plane are formed on the principal surface of the substrate 201 by selecting suitable etching conditions at this time.

Figure 7D:
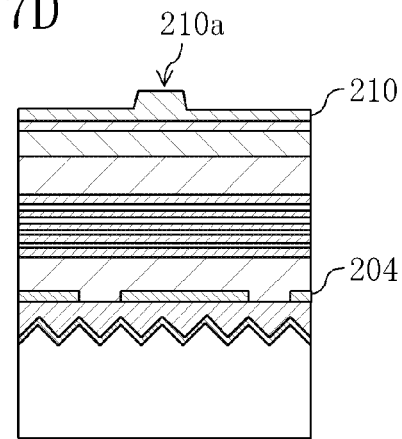
Figure 7B:
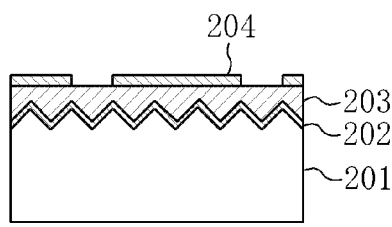

Next, as shown in FIG. 7B, the mask pattern is removed and then the initial layer 202 made of n-type AlN and the first n-type GaN layer 203 are epitaxially grown from the respective facet planes until its top surface becomes nearly flat by the MOCVD method. At this time, the principal surfaces of the epitaxially grown layer from the facet planes become the {1-101} plane. Subsequently, a SO₂ film is formed on the first n-type GaN layer 203, for example, by the CVD method and the formed SO₂ film is selectively wet-etched to form a mask film 204 having a stripe shape from the SO₂ film.

Figure 7E:
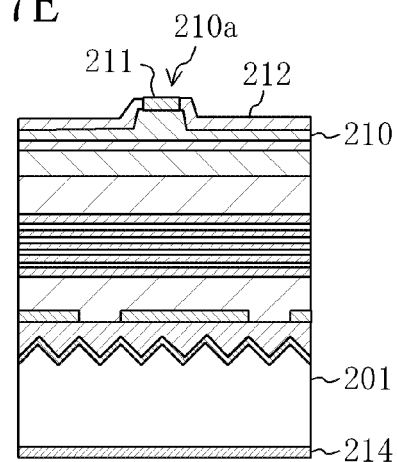
Figure 7C:
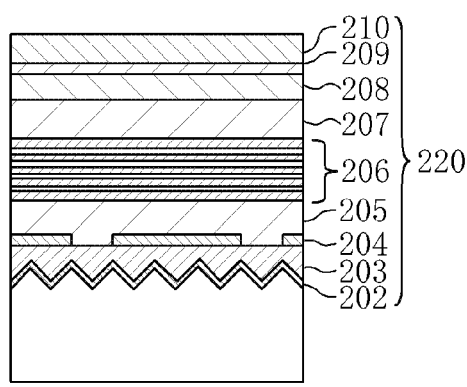

Next, as shown in FIG. 7C, the second n-type GaN layer 205, the periodic structure 206 made of n-type AlN/n-type GaN, the third n-type GaN layer 207, the n-type clad layer 208 made of n-type AlGaN, the MQW active layer 209 made of InGaN, and the p-type clad layer 210 made of p-type AlGaN are again epitaxially grown in succession on the first n-type GaN layer 203 through the respective apertures of the mask film 204 by the MOCVD method. In the second embodiment, the lateral growth by the mask film 204 is accelerated, so the crystal defects in the second n-type GaN layer 205 and in the respective semiconductor layers grown on the second n-type GaN layer 205 are decreased by a large amount. As described above, the plane orientation of the principal surface of the MQW active layer 209 becomes the {1-101} plane, so a polarized electric field produced in a direction perpendicular to the MQW active layer 209 is prevented. For this reason, the MQW active layer 209 resists being affected by the so-called quantum Stark effect and hence the light emission efficiency in the MQW active layer 209 can be improved. Moreover, just as with the first embodiment, the n-type semiconductor layer is doped with Si and the p-type semiconductor layer is doped with Mg. In the second embodiment, when current is passed through the MQW active layer 209, the MQW active layer 209 emits blue-violet light having a wavelength of 405 nm.

Next, as shown in FIG. 7D, a ridge part 210a, which extends in the shape of a stripe in a direction parallel to the <1-100> direction of the crystallographic axis in the semiconductor laminate 220 and has a width of from 1 μm to 2 μm and has a convex cross section, is formed at the top of the p-type clad layer 210 by the ICP etching using a Cl₂ gas for example. At this time, the ridge part 210a can be located in a region above the mask film 204 where crystallinity is more excellent and in a region which is above the mask film 204 and is not directly above the central portion of the mask film 204.

Next, as shown in FIG. 7E, a block layer 212 made of SiO₂ and having a film thickness of 200 nm is formed on the p-type clad layer 210 having the ridge part 210a formed by the CVD method, for example. Subsequently, an aperture is formed in the block layer 212 at a portion above the upper portion of the ridge part 210a. Subsequently, the p-side electrode 211 is formed by depositing Pd/Pt/Au in the aperture formed in the upper portion of the ridge part 210a in the block layer 212 by the electron beam deposition method and then by the use of the lift-off method. Then, AuSb/Au is deposited on the rear surface of the substrate 201 by the electron beam deposition method to form the n-side electrode 214.

Figure 7F:
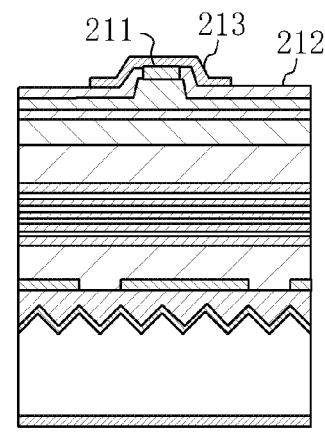

Next, as shown in FIG. 7F, a pad electrode 213 made of Ti/Au is formed so as to cover the p-side electrode 211. Here, an Au layer in the pad electrode 213 preferably has a comparatively large thickness for wire bonding and is formed by gold plating, for example.

As described above, according to the method for manufacturing a blue-violet semiconductor laser device in accordance with the second embodiment, the substrate 201 in which the plane orientation of the principal surface is the {100} plane is used and the {011} plane perpendicular to the {100} plane is made the cleavage face of the substrate 201. Further, the facets each having the plane orientation of the {111} plane are formed on the principal surface of the substrate 201. With this, the plane orientation of the principal surface of the semiconductor laminate 220 grown on the facets is made the {1-101} plane and the cleavage face in the semiconductor laminate 220 is made the {1-100} plane and is made parallel to the {011} plane which is the cleavage face of the substrate 201. As a result, the excellent cleavage faces can be formed in the laser structure formed on the substrate 201 made of Si.

With this, the nitride semiconductor laser device can be realized by the use of the inexpensive large-area Si substrate, a reduction in the cost of the nitride semiconductor laser device can be realized.

In this regard, in the semiconductor laminate of an epitaxial growth layer made of nitride semiconductor, which is used in the first embodiment, the second embodiment, and the modifications, a semiconductor laser device can be constructed by the use of, for example, a semiconductor of a hexagonal system. Further, when a semiconductor laminate is formed on a substrate in which the plane orientation of a principal surface is a {111} plane, a semiconductor laser device can be constructed by the use of any kind of semiconductor.

Further, as for the substrate, as far as a semiconductor laminate is formed on the principal surface of a substrate, which belongs a cubic system and in which the plane orientation of the principal surface is a {100} plane, via the thin film in which the plane orientation of the principal surface is a {111} plane or the indented and projected portions of facets in which the plane orientation of an exposed plane is a {111} plane, the substrate made of gallium arsenide (GaAs) or indium phosphide (InP) can be used.

As far as excellent crystal growth can be realized, a substrate and a semiconductor laminate may have an offset angle with respect to a principal surface.

Further, a method for growing a nitride semiconductor layer is not limited to the MOCVD method but a nitride semiconductor layer may be formed so as to include at least one layer of semiconductor layer formed by, for example, a molecular beam epitaxy (MBE) method or a hydride vapor phase epitaxy (HVPE) method.

As described above, in the nitride semiconductor laser device in accordance with the present invention, a cleavage face to make an excellent facet mirror can be produced in the semiconductor laminate made of group III-V nitride, so even when an inexpensive silicon substrate is used, a low threshold current and a low operating current can be realized. Thus, the nitride semiconductor laser device in accordance with the present invention is useful for a blue-violet semiconductor laser device or the like applicable to a light source for writing and reading a next-generation high-density optical disk.

What is claimed is:
1. A nitride semiconductor laser diode comprising:
a substrate made of silicon having a principal surface; and
a semiconductor laminate that includes a plurality of semiconductor layers including an active layer formed on the principal surface of the substrate, each of the plurality of semiconductor layers being made of group III nitride,
wherein the semiconductor laminate has a cleaved facet which forms a facet minor of the nitride semiconductor diode, the cleaved facet is parallel to a {001} plane which is a plane orientation of the silicon substrate, the substrate has indented and projected portions on its principal surface, a plane orientation of the indented and projected portions is a {111} plane, and the semiconductor laminate is epitaxially grown on the indented and projected portions.

2. The nitride semiconductor laser diode according to claim 1, wherein a plane orientation of a principal surface of the semiconductor laminate is a {1-101} plane in group III nitride.

3. The nitride semiconductor laser diode according to claim 1, wherein a cleaved facet of the semiconductor laminate is a {1-100} plane.

4. The nitride semiconductor laser diode according to claim 1, wherein the semiconductor laminate has a stripe-shaped waveguide structure extended perpendicularly to the cleaved facet, the waveguide structure being formed so as to be located above one indented portion of the indented and projected portions.

5. The nitride semiconductor laser diode according to claim 1, wherein the semiconductor laminate is electrically conductive in a portion formed between the active layer and the substrate, and wherein an electrode is formed on a plane opposite to the semiconductor laminate on the substrate.

6. The nitride semiconductor laser diode according to claim 1, wherein the semiconductor laminate has a periodic layer structure formed between the active layer and the substrate and formed of a first semiconductor layer and a second semiconductor layer which are different from each other in a composition ratio and in a refractive index and are alternately stacked, the periodic layer structure being composed so as to increase reflectivity of light emitted from the active layer.

7. The nitride semiconductor laser diode according to claim 6, wherein each of the first semiconductor layer and the second semiconductor layer has a thickness of one fourth of an optical wavelength corresponding to a wavelength of the emitted light.

8. The nitride semiconductor laser diode according to claim 6, wherein the first semiconductor layer is made of aluminum nitride, and wherein the second semiconductor layer is made of gallium nitride.

9. The nitride semiconductor laser diode according to claim 1, wherein the semiconductor laminate has a stripe-shaped waveguide structure, which is formed between the active layer, and the substrate, has a mask film having a plurality of apertures, is epitaxially grown selectively from the respective apertures of the mask film, and is extended perpendicularly to the cleavage face, the waveguide structure being formed so as to be located above a region except the apertures of the mask film.

10. The nitride semiconductor laser diode according to claim 1, wherein a plane orientation of the principal surface of the substrate is originally a {100} plane.

* * * * *